United States Patent [19]
Smith

[11] Patent Number: 6,075,271
[45] Date of Patent: Jun. 13, 2000

[54] SEMICONDUCTOR DEVICE INHIBITING PARASITIC EFFECTS DURING ELECTROSTATIC DISCHARGE

[75] Inventor: Jeremy C. Smith, Austin, Tex.

[73] Assignee: Motorola, Inc., Schaumburg, Ill.

[21] Appl. No.: 09/033,752

[22] Filed: Mar. 3, 1998

[51] Int. Cl.[7] .......................... H01L 29/76; H01L 29/94; H01L 31/062; H01L 31/113; H01L 31/119
[52] U.S. Cl. ...................... 257/373; 257/372; 257/375; 257/376; 257/355
[58] Field of Search .................................. 257/373, 375, 257/376, 394, 372, 900, 355

[56] References Cited

U.S. PATENT DOCUMENTS

| | | | |
|---|---|---|---|
| 4,811,076 | 3/1989 | Tigelaar et al. | 357/51 |
| 5,019,888 | 5/1991 | Scott et al. | 357/41 |
| 5,021,853 | 6/1991 | Mistry | 357/23.13 |
| 5,157,573 | 10/1992 | Lee et al. | 361/56 |
| 5,225,702 | 7/1993 | Chatterjee | 257/360 |
| 5,440,162 | 8/1995 | Worley et al. | 257/355 |
| 5,465,189 | 11/1995 | Polgreen et al. | 361/91 |
| 5,635,746 | 6/1997 | Kimura et al. | 257/382 |
| 5,682,054 | 10/1997 | Nakashima | 257/401 |
| 5,747,853 | 5/1998 | So et al. | 257/355 |

OTHER PUBLICATIONS

"Substrate Triggering and Salicide Effects on ESD Performance and Protection Circuit Design in Deep Submicron CMOS Processes," Amerasekera, et al; IEDM 95; pp. 547–550.

"A Substrate Triggered Lateral Bipolar Circuit for High Voltage Tolerant ESD Protection Applications," Smith.

"EOS/ESD Analysis of High–Density Logic Chips," Ramaswamy, et al; EOS/ESD Symposium 96; pp. 286–290.

"Analysis of Snubber–Clamped Diode–String Mixed Voltage Interface ESD Protection Network for Advanced Microprocessors," Voldman, et al.; EOS/ESD Symposium 95; pp. 43–61.

*Primary Examiner*—Mahshid Saadat
*Assistant Examiner*—Jesse A. Fenty

[57] ABSTRACT

A semiconductor device (10) having a stacked-gate buffer (30) wherein the stacked-gate buffer (30) has a substrate (65) and a top substrate region (70) both with the same first conductivity type. The buffer (30) also has two transistors (95.105), each with a current carrying electrode and a control electrode (90, 100). A deep doped region (120) lies between the first (90) and second (100) control electrodes where the deep doped region (120) is another current carrying electrode for the first transistor (95) and another current carrying electrode for the second transistor (105) and the deep doped region (120) has a second conductivity that is opposite the first conductivity type. A deeper doped region (80) is also part of the stacked-gate buffer which has a second conductivity type and lies between the first (90) and second (100) control electrodes and is deeper than the deep doped region (120). A method of forming the device is also provided herein.

7 Claims, 3 Drawing Sheets

SEMICONDUCTOR DEVICE INHIBITING PARASITIC EFFECTS DURING ELECTROSTATIC DISCHARGE

FIELD OF THE INVENTION

The present invention generally relates to semiconductor devices, and more particularly, to a semiconductor device having a stacked-gate buffer that inhibits parasitic bipolar effects during electrostatic discharge (ESD) or electrical overstress (EOS) and a method of forming such device.

BACKGROUND OF THE INVENTION

As semiconductor devices move to smaller geometries, system level power supply voltages must also be scaled downward. However, system level power supply voltages have scaled at a much slower rate than individual chip supply voltages, requiring high voltage tolerant input and output pads to limit the maximum voltages appearing across semiconductor devices on the integrated circuit that may be damaged by the high voltage. In particular, input and output buffers must utilize certain circuit configurations such as two NMOS (N-channel metal oxide semiconductor) transistors in series (stacked-gate) to protect internal devices from the magnitude of externally applied signals which usually exceed the maximum allowable drain-to-source, drain-to-gate and gate-to-source voltages of the submicron technology used to fabricate the chip. Such buffers must also be capable of withstanding ESD and EOS discharges without being damaged by such events.

A well-known problem that causes buffers to fail during ESD events is a phenomenon known as bipolar snapback. During bipolar snapback, a parasitic bipolar device formed by a n+ diffusion coupled to the bondpad (collector) and a n+ diffusion coupled to the chip $V_{SS}$ (emitter), can conduct large amounts of ESD discharge current by means of a self-biased mechanism. The self-biasing results from avalanche-breakdown at the collector/base (i.e. n+ pad to p-substrate) diffusion where avalanche-generated electron-hole pairs are created. The holes generated from this effect migrate towards the emitter where they forward bias the base-emitter junction (i.e. n+ $V_{SS}$ to p-substrate) of the parasitic device, thereby turning the device on. Usually, the bipolar device implicitly contained in the NMOS device of the output buffer is the most susceptible. This unavoidable parasitic device is usually the weak link during ESD and EOS events and is almost always the point of failure in the buffer, and consequently, the pad.

One well-known solution to alleviate this parasitic bipolar problem is to add a ballast resistor connected between the drain of the first NMOS transistor and an output pin. This technique helps ensure some added measure of ESD protection in the event of bipolar conduction in the buffer by equally distributing any discharge current through the NMOS transistor (or several fingers forming a single NMOS transistor). The ballast resistor is added to ensure that the failure point at a particular collector-to-emitter voltage $V_{T2}$ is greater than the collector-to-emitter voltage, $V_{T1}$, where the current begins to flow in the parasitic bipolar transistor. The relationship between $V_{T1}$ and $V_{T2}$ is as follows. When several NMOS transistors (or several fingers forming a single NMOS transistor) act as a parasitic bipolar device, such a device relies upon the "snap-back" current-voltage characteristics of the parasitic bipolar transistor formed. As stated above, a current begins to flow through the bipolar transistor at a certain collector-to-emitter voltage, $V_{T1}$. Thereafter the collector-to-emitter voltage decreases as the current increases, "snapping back" from $V_{T1}$. Later, the trend reverses, causing the collector-to-emitter voltage to rise as the current also rises. Eventually, the bipolar transistor fails at another particular collector-to-emitter voltage $V_{T2}$. The ballast resistor ensures that $V_{T2}$ is greater than $V_{T1}$ so that the first NMOS transistor (or finger of the NMOS transistor) does not breakdown at a voltage less than the voltage at which the second NMOS transistor turns on. This in turn guarantees that the failure current of the complete device is the sum total of its individual components rather than that of the first segment which snaps-back.

However, using the ballast resistor has certain drawbacks. First, the electrical performance of the buffer is deteriorated since the magnitude of the ballast resistance (approximately 50 ohms per finger) is large. Secondly, ballast resistors work best when there is some margin of $I_{T2}$. $I_{T2}$ is the destructive failure current threshold associated with $V_{T2}$, the destructive failure voltage. Since ballasting more strongly impacts $V_{T2}$ rather than $I_{T2}$, there is only marginal benefit to adding ballast resistance if $I_{T2}$ is already low. In most modern submicron semiconductor processes $I_{T2}$ is low because of use of shallow salicided source/drain junctions and epitaxial substrates. Thus, the conventional wisdom of adding ballast resistance must be reexamined when designing modern I/O pad circuitry. Thirdly, the ballast resistor adds additional circuitry and further area needed on the substrate which increases costs. The area needed for ballasting is further compounded for the case of the series-connected (stacked-gate) NMOS devices since an enlarged gate-to-gate spacing is needed to reduce bipolar effects in this device. The parasitic bipolar present in the stacked-gate device is formed between the top diffusion connected to the bond pad and the bottom diffusion connected to the chip $V_{SS}$ electrode. Thus, increasing the gate-to-gate spacing increases the basewidth of the parasitic device, which reduces bipolar effects. The additional area taken by the ballast resistor only adds to an already enlarged buffer.

A need therefore exists for a stacked-gate buffer that avoids the drawbacks of using a ballast resistor.

BRIEF DESCRIPTION OF THE DRAWINGS

A better understanding of the present invention can be obtained when the following detailed description of a preferred embodiment is considered in conjunction with the following drawings, in which.

Figure 1:
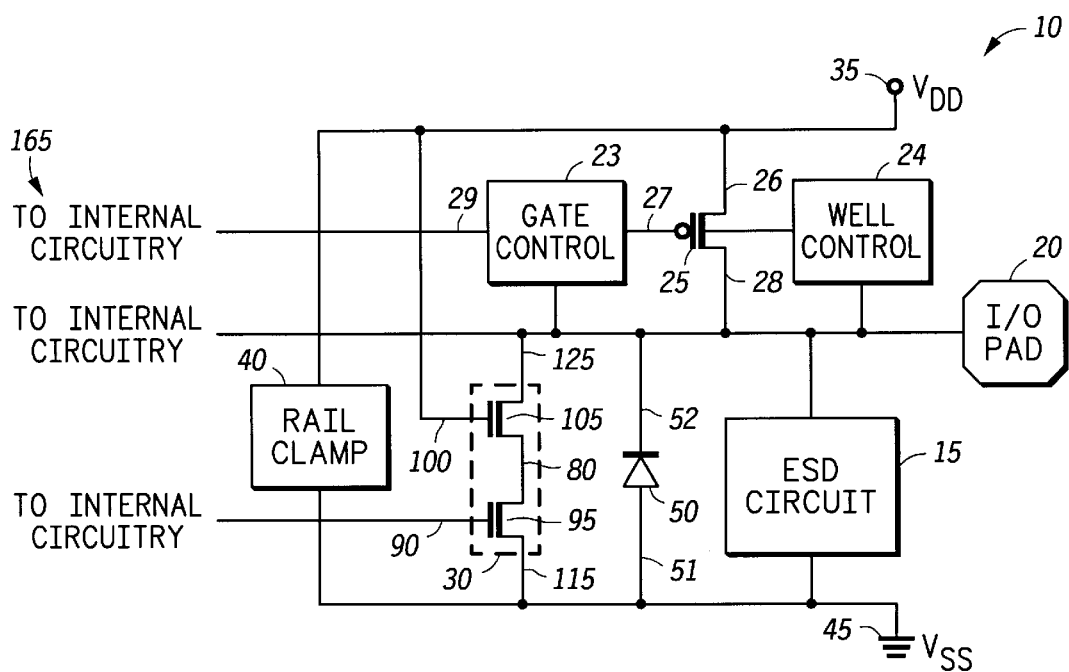
FIG. 1 depicts a partial block diagram, partial schematic diagram of a semiconductor device having a stacked-gate buffer.

It will be appreciated that for simplicity and clarity of illustration, elements illustrated in the drawings have not necessarily been drawn to scale. For example, the dimensions of some of the elements are exaggerated relative to other elements for purposes of clarity. Further, where considered appropriate, reference numerals have been repeated among the drawings to represent corresponding or analogous elements.

DETAILED DESCRIPTION OF A PREFERRED EMBODIMENT

The present invention includes a semiconductor device having a buffer. The buffer comprises a substrate having a first conductivity type; a top substrate region having the first conductivity type; a first transistor having first current carrying electrode and a first control electrode; a second transistor having a second current carrying electrode and a second control electrode; at least one deep doped region has a second conductivity type that is opposite the first conductivity type; and a deeper doped region having the second conductivity type. The substrate includes a first portion overlying a second portion. The first and second portions have the first conductivity type, and the first portion has a lower doping concentration compared to the second portion. The at least one deep doped region is another current carrying electrode for the first transistor and another current carrying electrode for the second transistor. The at least one deep doped region lies lying between the first and second control electrodes. The deeper doped region lies between the first and second control electrodes. The deeper doped region is deeper than the at least one deep doped region and extends at least to the second portion. Referring to the substrate, the first and second portions have the first conductivity type, and the first portion has a lower doping concentration compared to the second portion.

The embodiments of the present invention will now be described in detail with reference to FIGS. 1–7. It is noted that throughout this detailed description, certain layers of materials will be deposited and removed to form the semiconductor device. Where the specific procedures for depositing such layers or thicknesses of such layers are not detailed below, conventional techniques to one skilled in the art for depositing or otherwise forming such layers at appropriate thicknesses shall be intended. Such details are well known and not considered necessary to teach one skilled in the art of how to make or use the present invention.

FIG. 1 is a partial block diagram, partial schematic diagram of a semiconductor device, known as an input/output (I/O) driver circuit 10 having a stacked-gate buffer 30. The I/O driver circuit 10 has an ESD circuit 15 that provides protection against ESD and EOS events. The ESD circuit 15 may be any standard ESD circuit that is well known in the art. The structural detail of the ESD circuit 15 is not necessary for one of ordinary skill in the art to make or use the stacked-gate buffer 30 of the present invention and, accordingly, such detail will not be provided herein. The I/O driver circuit 10 has an I/O pad 20 that receives or generates a voltage level that is transmitted to the I/O driver circuit 10 or to an external device. The I/O pad 20 may output voltages in the range of 0 to 3.3 volts, or in other embodiments, the I/O pad 20 may receive voltage levels from other devices external to the I/O driver circuit 10 which may also be in the range of between 0 to 5.0 volts. The I/O pad 20 is connected to a current electrode 28 of a p-type metal oxide semiconductor field-effect transistor (MOSFET) 25 (PMOS pull-up buffer) and to a second current carrying electrode 125 of a stacked-gate buffer 30. Another current electrode 26 of the MOSFET 25 is coupled to a second power supply electrode ($V_{DD}$) 35. The second power supply electrode 35 is coupled to a second control electrode 100 of a second transistor 105 of the stacked-gate buffer 30. A gate electrode 27 of the MOSFET 25 is coupled to internal circuitry that controls the MOSFET 25. Likewise, the I/O pad 20 and the second current carrying electrode 125 of the second transistor 105 of the stacked-gate buffer 30 are also connected to internal circuitry for additional processing. A rail clamp 40 may be the inherent capacitance of an integrated circuit incorporating the I/O driver circuit 10, if it is sufficient, or may be an active circuit that provides a discharge path between the second power supply electrode 35 and a first power supply electrode 45 during an ESD or EOS event. The first power supply electrode 45 is coupled to the ESD circuit 15, the rail clamp 40 and a first current carrying electrode 115 of the first transistor 95 of the stacked-gate buffer 30. The first power supply electrode 45 is also coupled to a first terminal 51 of diode 50 such that the diode conducts when the first power supply electrode 45 is approximately 0.5 volts higher than the voltage present on the I/O pad 20 which is connected to the diode 50 by the second terminal 52.

In the stacked-gate buffer 30, a first transistor 95 is connected in series to a second transistor 105. Typically, the first 95 and second 105 transistors are field effect transistors, each having a source region, a drain region and control electrodes. The first transistor 95 has a source region depicted as the first current carrying electrode 115 and a deep doped region 80 that is both a source region of the second transistor 105 and a drain region for the first transistor 95. The deep doped region 80 is another current carrying electrode for both the first 95 and second 105 transistors. The second transistor 105 has a drain region depicted as the second current carrying electrode 125. The first transistor 95 has a first control electrode 90 while the second transistor 105 has a second control electrode 100. The stacked-gate buffer is part of an output buffer. The general operation of the I/O driver circuit is as follows. Transistor 25 and stacked-gate buffer 30 form an output buffer which is used to transfer signals generated within the chip to devices external to the chip via I/O pad 20. Transistor 25 forms the pull-up portion of the output buffer which is used to couple I/O pad 20 to the $V_{DD}$ supply rail 35 thereby supplying a high level signal (3.3 V). Stacked-gate buffer 30 is used to couple the I/O pad 20 to the first supply electrode 45 (i.e. forms a pull-down portion), thereby supplying a low level signal (0 V). When the I/O driver circuit 10 is functioning as an output buffer, the internal circuitry (not shown) simultaneously supplies the signal to be output to the input terminal 29 of gate control circuit 23 (which simply passes the signal to the control electrode 27 of transistor 25 in this mode) and to the control electrode 90 of stacked-gate buffer 30.

If the I/O buffer 10 is used as an input driver circuit, the internal circuitry (not shown) maintains the input terminal 29 of the gate control circuit 23 (and consequently the control electrode 27 of transistor 25) at 3.3 V, and the control electrode 90 of transistor 95 at 0 V, which prevents current flow in either transistor. The I/O pad 20 is now free to receive signals which are generated external to the chip and are subsequently processed by internal circuitry (not shown). The range of these externally applied input signals for high-voltage tolerant applications is between 0 V and 5.0 V. For external signals which exceed $V_{DD}$ (3.3 V), gate control circuit 23 raises the control electrode 27 of transistor 25 to the potential of the I/O pad 20, which guarantees that transistor 25 remains off. Gate control circuit 23 also keeps the new high potential from appearing at node 29 which is maintained at 3.3 V. The series connection of transistors 105 and 95 is also used to accommodate the application on input signals in excess of the second power supply electrode 35 (3.3 V), the magnitude of which typically exceeds the maximum $V_{DS}$ and $V_{DG}$ of most submicron technologies (approximately 3.6 V). For example, if 5.0 V is applied to I/O pad 20, then the full magnitude of this potential appears across each transistor of the stacked-gate buffer 30. However, the magnitude of the potentials across each transistor in 30 does not exceed maximum allowable values. For example, when 5.0 V is applied to I/O pad 20, the maximum potential that can appear at node 80 is $V_{DD}-V_{TN}$, or roughly, 3.3 V–0.5 V=2.8 V. Thus, the maximum $V_{DS}$ across transistor 105 is 2.2 V and across transistor 95 is 2.8 V. The externally applied 5 V signal has been split between the series connection of transistor 105 and transistor 95. Similarly, the maximum allowable $V_{DG}$ has also not been exceeded since only 5.0 V–3.3 V=1.7 V will appear across the drain to gate terminals of the second transistor 105, and 2.8 V–0 V=2.8 V will appear across the drain to gate terminals of the first transistor 95. Thus, the use of the stacked-gate buffer 30 facilitates the application of high voltage input signals to I/O pad 20 in a manner which is compatible with a standard logic process. In a similar manner, well control circuit 24 and gate control circuit 23 are needed to keep the PMOS pull-up buffer 25 from conducting during the application of the external high voltage signal. The structural details of well control circuit 24 and gate control circuit 23 are not necessary for one of ordinary skill in the art to make or use the stacked-gate buffer 30 of the present invention and, accordingly, such detail will not be provided herein.

Figure 2:
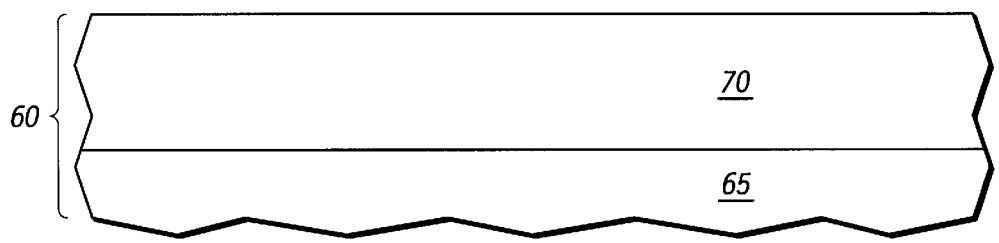
FIG. 2 depicts a cross-sectional view of a step in the method of forming the stacked-gate buffer of the present invention.

An embodiment of the present invention is related to a method of forming the stacked-gate buffer 30 of the semiconductor device (the I/O driver circuit 10 in this embodiment). As such, the following method steps will be directed to an embodiment of the method of forming the stacked-gate buffer 30 of the I/O driver circuit 10. FIG. 2 depicts a cross-sectional view of a step in the method of forming the stacked-gate buffer of the present invention. It is understood, however, that the scope of the invention as claimed below may be directed to an input buffer in an alternative embodiment. In FIG. 2, a semiconductor device substrate 60 has a substrate 65 and a top substrate region 70 on the substrate 65. The substrate 65 is typically a silicon substrate, however, germanium, silicon germanium, silicon-on-insulator or the like may also be used. The substrate 65 is doped with a dopant having a first conductivity type, typically a p++ type dopant, while the top substrate region 70 is also doped with a dopant having the same first conductivity type, typically p-type dopant, that is epitaxially grown on the substrate 65. It is understood that the top substrate region 70 may already be formed on the semiconductor device substrate and thereby not requiring the doping step previously described. While both the substrate 65 and top substrate region 70 have the same first conductivity type, the top substrate region 70 has a lower doping concentration that the doping concentration of the substrate 65. A direct result of the increased doping level of substrate 65 relative to top substrate 70 is that substrate 65 exhibits a greatly reduced resistivity when compared to top substrate region 70. In general, a low resistivity substrate is highly desirable in submicron technologies since it suppresses the occurrence of the well known phenomenon called "latch-up". In a further embodiment, the semiconductor device substrate 60 may also be a substrate having a first portion 70 overlying a second portion 65. Both the first 70 and second 65 portions have a first conductivity type, for example a p-type doping concentration, and the first portion 70 has a lower doping concentration compared to the second portion 65. Again, in this embodiment, the first portion 70 is typically an epitaxially grown silicon layer having a p-type dopant concentration. Accordingly, it is the comparative doping concentration between the two portions in one embodiment or the substrate and the top substrate region in another embodiment that is important.

Figure 3:
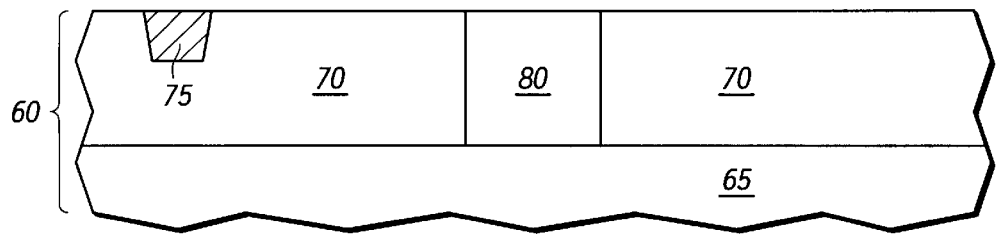
FIG. 3 depicts a cross-sectional view of a further stage in the method of forming the stacked-gate buffer of the present invention.

FIG. 3 depicts a cross-sectional view of a further stage in the method of forming the stacked-gate buffer of the present invention. In FIG. 3, two regions have been formed in the top substrate region 70. An insulating region 75 is formed in the top substrate region 70 in order to provide isolation between the stacked-gate buffer 30 of FIG. 1 and other devices in the I/O driver circuit 10. The isolation region 75 is typically an oxide and may be formed using typical shallow trench techniques or LOCOS techniques to isolate the devices in the semiconductor device substrate 60. A deeper doped region 80 is also formed, in the step depicted in FIG. 3, in the top substrate region 70 of the semiconductor device substrate 60. The deeper doped region 80 is doped with a dopant, such as an n-type dopant, having a second conductivity type that is opposite the first conductivity type of the substrate 65 and the top substrate region 70. The deeper doped region 80 is typically at least 0.5 microns deep and generally extends to at least the substrate 65. The deeper doped region 80 greatly increases the path that avalanche generated "holes" must travel in order for the bipolar snapback to occur. The "depth" of the deeper doped region 80 effectively greatly increases the $V_{T1}$, where the current begins to flow in the parasitic bipolar transistor. This, in turn, provides a more stable ESD protection circuit.

Figure 4:
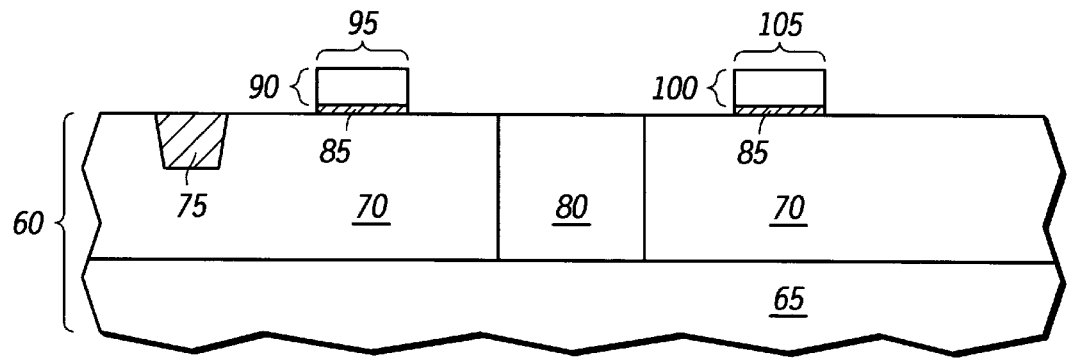
FIG. 4 depicts a cross-sectional view of a still further stage of the method of forming the stacked-gate buffer of the present invention.

FIG. 4 is a cross-sectional view of a still further stage of the method of forming the stacked-gate buffer of the present invention. In FIG. 4, a gate dielectric layer 85 has been formed, using conventional techniques, on the top substrate region 70 of the semiconductor device substrate 60. The gate dielectric layer 85 is typically an oxide layer of approximately 30 to 100 angstroms in thickness. A first control electrode 90 and a second control electrode 100 is then formed after the step of forming the gate dielectric layer 85. The first 90 and second 100 control electrodes are typically a doped polysilicon material, however, other metal containing materials, metal nitrides, or metal suicides may also be used. The first transistor 95 and the second transistor 105 are then formed by patterning the gate dielectric layer 85 and the control electrodes 90, 100. The control electrodes 90, 100, also considered gate electrodes, control the first 95 and second 105 transistors. The deeper doped region 80 lies between the first 90 and second 100 control electrodes.

Figure 5:
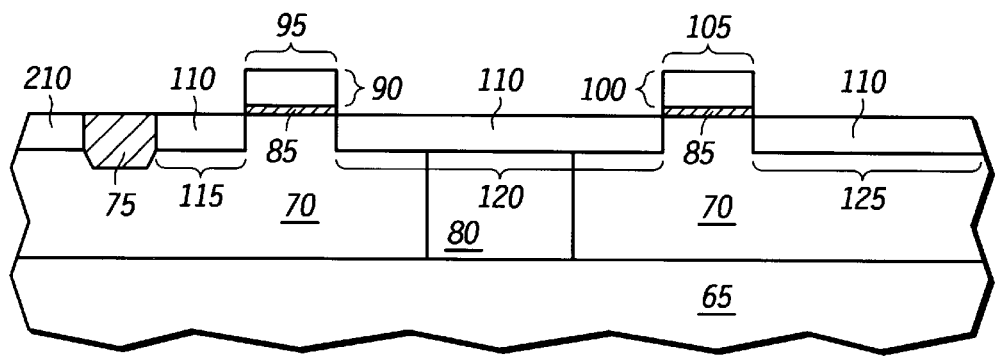
FIG. 5 depicts a cross-sectional view of another stage of the method of forming the stacked-gate buffer of the present invention.

FIG. 5 is a cross-sectional view of another stage of the method of forming the stacked-gate buffer of the present invention. In FIG. 5, a substrate tie region 210 is formed which is doped with a dopant of similar conductivity type to the substrate 65 and top substrate region 70. The substrate tie region 210 is used as an ohmic contact to the substrate 65 and top substrate region 70 and is ultimately coupled to the chip first power supply electrode 45 of FIG. 1. Since the substrate 65 has a lower resistivity than top substrate region 70, the substrate 65 is ultimately more strongly coupled to the first power supply electrode 45 (ground). Thus, substrate 65 can more efficiently extract excess holes due to its lower resistivity (i.e., it has lower resistance). Next in FIG. 5, shallow doped regions 110 have been formed in the top substrate region 70 and adjacent to the first 90 and second 100 control electrodes. The, shallow doped regions 110 are doped with a dopant having a second conductivity type, typically an n-type dopant, that is opposite the first conductivity type of the semiconductor device substrate 60. The shallow doped regions 110 form source and drain regions of the first 95 and second 105 transistors. Specifically, the shallow doped region 110 forms a first current carrying electrode 115 which is a source region for the first transistor 95 while the shallow doped region 110 forms a another current carrying electrode 120 which is a drain region for the first transistor 95 and a source region for the second transistor 105. The shallow doped region 110 also forms a second current carrying electrode 125 which is a drain region for the second transistor 105. As such, the first 95 and second 105 transistors are electrically connected in series (stacked-gate).

The current carrying region 120 lies between the first 90 and second 100 control electrodes and has an important relation to the deeper doped region 80. Namely, that the deeper doped region 80 is at least approximately 1.5 times deeper than the shallow doped region 110. Typically, the shallow doped region 110 is no more than approximately 0.3 microns deep. The depth of the deeper doped region 80 is important because the deeper doped region 80 acts as a "barrier" for the avalanche generated holes that generally cause the bipolar snapback problems. Since the holes are blocked laterally, a higher percentage of the holes reach the substrate 65 where they are shunted to ground and eventually removed from the substrate via deep doped substrate tie region 210 (and similar regions elsewhere in the chip) and thereby increases the $V_{T1}$ of the device. Thus, the deeper doped region 80 is used for its "depth", forcing the holes deep into the substrate 65 (and out of the top substrate region 70) where such holes may initiate bipolar action. The deeper doped region 80 greatly increases the $V_{T1}$ (point at which bipolar snapback occurs) which gives the ESD protection circuit 15 more room to operate while protecting the I/O driver circuit 10 of FIG. 1. The benefit of increased $V_{T1}$ is also derived for semiconductor technologies which do not employ a separate substrate/top substrate layers (or where deeper doped region 80 does not extend to substrate region 65), since the avalanche generated holes will still see the increased path length around deeper doped region 80. This is because the parasitic bipolar in stacked-gate buffer 30 is still greatly degraded since the bipolar is "pushed" deeper into the substrate "around" deeper doped region 80, which dramatically increases its effective basewidth. Instead of increasing basewidth by increasing the gate-to-gate spacing of stacked-gate buffer 30, as previously done, the present invention allows the vertical dimension (i.e., into the substrate) to be exploited rather than lateral spacing, the latter of which consumes area which increases manufacturing costs. Thus, the deeper doped region 80 replaces the need for a ballast resistor since it inhibits bipolar action rather than attempting to control its detrimental effects once it occurs. The extra area needed on the top substrate region 70 to place the ballast resistor is not needed which decreases manufacturing costs.

Figure 6:
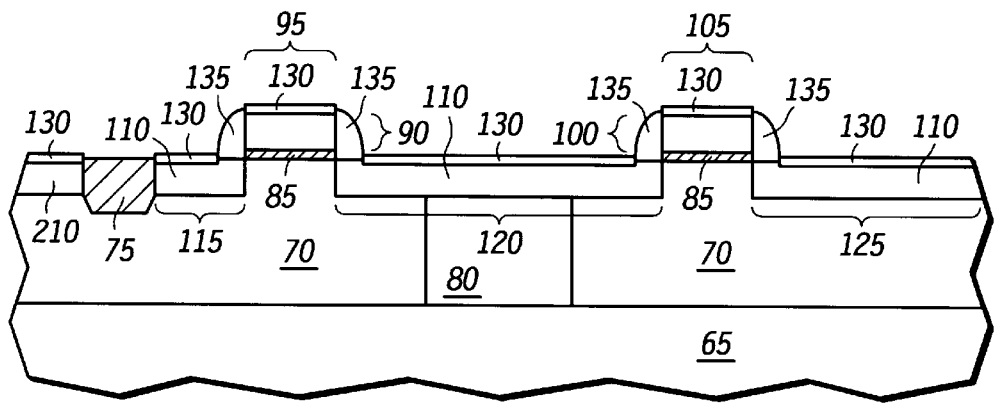
FIG. 6 depicts a cross-sectional view of still another stage of the method of forming the stacked-gate buffer of the present invention.

FIG. 6 is a cross-sectional view of still another stage of the method of forming the buffer of the present invention. In FIG. 6, spacers 135 have been formed adjacent to the first 90 and second 100 control electrodes. The spacer regions 135 are typically formed of silicon nitride, and are necessary to keep the first 90 and the second 100 control electrodes electrically isolated from shallow doped regions 110 after the deposition of the metal containing layer 130 as described below. A metal containing layer 130 is then deposited over the first 90 and second 100 control electrodes and over the deep doped regions 110, substrate tie region 210 and the top substrate region 70. The metal containing layer 130 reacts with portions of the first 90 and second 100 control electrodes, the shallow doped region 110, substrate tie region 210 and the top substrate region 70 to form salicide regions 130. Any unreacted portions of the metal containing layer 130 is then removed. The salicide regions 130 add a further advantage to the present embodiment of the invention over ballast resistors. Ballast resistors generally deteriorate the electrical performance of a buffer since the magnitude of the ballast resistor is typically large. However, in the present embodiment, the salicide regions 130 have a minimal impact on the electrical performance of the buffer since their resistance is low and have no effect on the $V_{T1}$ of the stacked-gate buffer.

Figure 7:
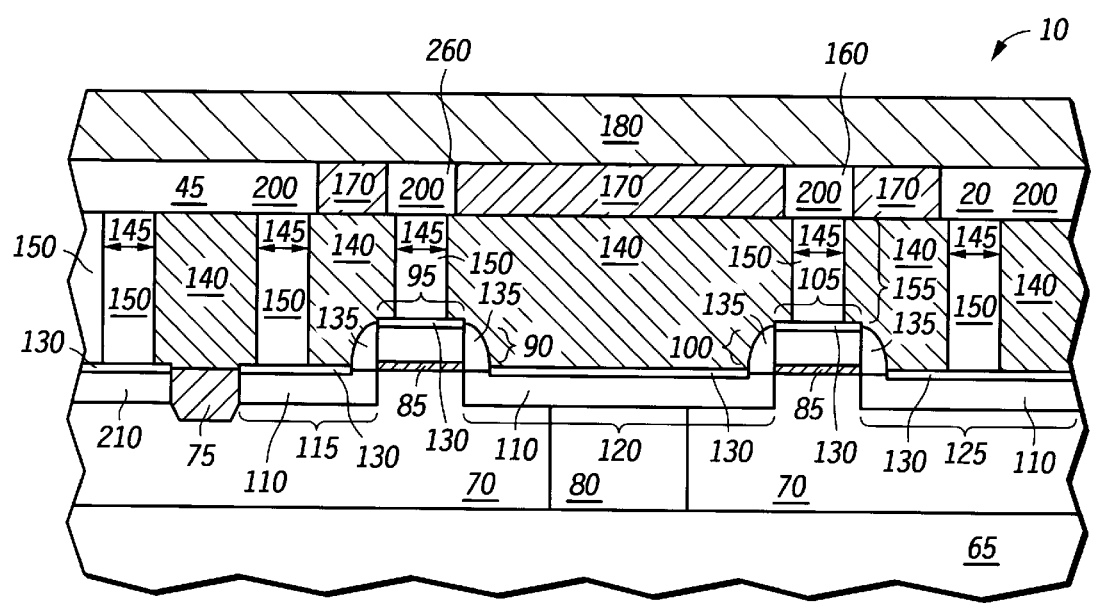
FIG. 7 depicts a cross-sectional view of the stacked-gate buffer of the present invention.

FIG. 7 is a cross-sectional view of the stacked-gate buffer of the present invention. In FIG. 7, an interlayer dielectric layer 140 has been deposited over the semiconductor device of FIG. 6 and patterned to form the contacts 145 in the interlayer dielectric 140. In the contacts 145, a metal containing layer 150 is deposited in the contacts so that the first current carrying electrode 115 and substrate tie region 210 is electrically connected to the first power supply electrode 45. The metal containing layer 150 is typically tungsten, however aluminum and aluminum silicides or copper may also be used. The second current carrying electrode 125 of the second transistor 105 acts as a drain region for such transistor 105 and is electrically connect to the I/O pad 20. A first interconnect 160 electrically connects the second control electrode 100 to the second power supply electrode 35. A second interconnect 260 electrically connects the first control electrode 95 to internal circuitry. After the metal containing layer 150 is deposited and patterned, a second interlayer dielectric 170 is formed and patterned. Next, the second metal containing layer 200 is formed and patterned. Then, a passivation layer 180, which may be several layers, is formed thereon to protect the device. The passivation layer 180 may be silicon nitride, silicon oxide, silicon oxynitride, polymide or a combination thereof.

In operation, the deeper doped region 80 serves to greatly inhibit the initiation of bipolar action by creating a blocking of, or a long path for, avalanche generated holes needed in order to forward bias the parasitic bipolar transistor formed by the transistors 95 and 105. By forcing the holes around the deeper doped region 80, the holes are sent through the low resistance p++ substrate 65 and effectively shunted to ground to ensure that the parasitic bipolar transistor does not turn on. In alternative embodiments, where a p++ substrate 65 is not used, or where deeper doped region 80 does not extend to substrate 65, the long path around deeper doped region 80 effectively degrades the parasitic bipolar transistor. Thus, the bipolar formed by transistors 95 and 105 will not break down and be damaged, and accordingly, the stacked-gate buffer 30 will remain operational.

It is understood that additional embodiments may also be formed that fall within the scope of the present invention as claimed below.

I claim:

1. A semiconductor device having a buffer, wherein said buffer comprises:
   a substrate having a first conductivity type, wherein:
   said substrate includes a first portion overlying a second portion;
   said first and second portions have said first conductivity type; and said first portion has a lower doping concentration compared to said second portion;
a top substrate region having said first conductivity type;
a first transistor having a first current carrying electrode and a first control electrode;
a second transistor having a second current carrying electrode and a second control electrode;
at least one deep doped region lying between said first and second control electrodes,
wherein said at least one deep doped region:
is another current carrying electrode for said first transistor and another current carrying electrode for said second transistor; and
has a second conductivity type that is opposite said first conductivity type; and
a deeper doped region having said second conductivity type, wherein said deeper doped region:
lies between said first and second control electrodes;
is deeper than said at least one deep doped region; and
said deeper doped region extends at least to said second portion;
said first and second portions have said first conductivity type; and
said first portion has a lower doping concentration compared to said second portion.

2. The semiconductor device of claim 1, wherein said buffer is a stacked-gate buffer.

3. The semiconductor device of claim 1, wherein:
said first and second transistors are field-effect transistors;
said first current carrying electrode is a source region;
said second current carrying electrode is a drain region; and
said first and second control electrodes are gate electrodes.

4. The semiconductor device of claim 1, wherein said deeper doped region is at least approximately 0.5 um deep, and wherein said at least one deep doped region is no more than approximately 0.3 um deep.

5. The semiconductor device of claim 1, wherein said deeper doped region is at least approximately 1.5 times deeper than at least one deep doped region.

6. The semiconductor device of claim 1, further comprising:
a pad that is electrically connected to said second current carrying electrode of said second transistor; and
a first power supply electrically connected to said first current carrying electrode of said first transistor.

7. The semiconductor device of claim 1, wherein said first and second current carrying electrodes include salicide regions.

* * * * *